(12) United States Patent
Yamazaki et al.

(10) Patent No.: US 6,337,229 B1
(45) Date of Patent: *Jan. 8, 2002

(54) METHOD OF MAKING CRYSTAL SILICON SEMICONDUCTOR AND THIN FILM TRANSISTOR

(75) Inventors: Shunpei Yamazaki, Tokyo; Mitsunori Sakama; Yasuhiko Takemura, both of Kanagawa, all of (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/572,008

(22) Filed: Dec. 14, 1995

(30) Foreign Application Priority Data

Dec. 16, 1994 (JP) ............................... 6-333877

(51) Int. Cl.[7] .............................................. H01L 21/00
(52) U.S. Cl. ........................ 438/149; 438/166; 438/487
(58) Field of Search .................. 148/DIG. 16, DIG. 60; 257/57, 64, 65, 66, 75; 438/149, 166, 486, 487

(56) References Cited

U.S. PATENT DOCUMENTS

| | | | |
|---|---|---|---|
| 3,783,049 A | * | 1/1974 | Sandera |
| 4,335,161 A | * | 6/1982 | Luo ............... 427/86 |
| 4,343,081 A | * | 8/1982 | Morin et al. ............ 437/189 |
| 4,379,020 A | * | 4/1983 | Glaesser et al. |
| 4,624,737 A | * | 11/1986 | Shimbo ............... 437/189 |
| 5,120,667 A | * | 6/1992 | Tarui et al. ............ 437/21 |
| 5,147,826 A | | 9/1992 | Liu et al. ............. 437/233 |
| 5,275,851 A | | 1/1994 | Fonash et al. ........... 437/233 |
| 5,313,075 A | * | 5/1994 | Zhang et al. .............. 257/57 |

(List continued on next page.)

FOREIGN PATENT DOCUMENTS

| | | |
|---|---|---|
| EP | 0 612 102 | 8/1994 |
| JP | 58-102560 | * 6/1983 |
| JP | 3-280420 | 12/1991 |
| JP | 5-152311 | * 6/1993 |
| JP | 6-244103 | * 9/1994 |

OTHER PUBLICATIONS

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

*Primary Examiner*—Tuan H. Nguyen
(74) *Attorney, Agent, or Firm*—Eric J. Robinson; Nixon Peabody LLP

(57) ABSTRACT

To provide a crystalline silicon film showing properties preferable to a semiconductor device such as a thin film transistor (TFT) etc., a silicon oxide film is deposited on a glass substrate by a CVD process such as plasma CVD process, thermal CVD process or the like and an amorphous silicon film is continuously deposited thereon without bringing the silicon oxide film into contact with the atmosphere. The amorphous silicon film is annealed at 500 through 600° C. by adding a catalyst element such as nickel thereto and crystallized. A crystal silicon film having improved crystalline property is provided by further irradiating a laser beam thereon. In the provided crystalline silicon film the catalyst element diffuses to silicon oxide under the silicon film and the concentration of the catalyst element in the silicon film is lowered. By using the crystalline silicon film a semiconductor device such as TFT etc. having improved property (especially small off current) can be achieved.

33 Claims, 4 Drawing Sheets

U.S. PATENT DOCUMENTS

| | | | |
|---|---|---|---|
| 5,403,772 A | * 4/1995 | Zhang et al. | 437/101 |
| 5,426,064 A | * 6/1995 | Zhang et al. | 437/40 |
| 5,474,942 A | * 12/1995 | Kodaira et al. | 437/21 |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,529,937 A | * 6/1996 | Zhang et al. | 437/10 |
| 5,534,716 A | 7/1996 | Takemura | |
| 5,543,352 A | * 8/1996 | Ohtani et al. | 437/101 |
| 5,550,070 A | * 8/1996 | Funai et al. | 437/101 |
| 5,563,426 A | 10/1996 | Zhang et al. | |
| 5,569,610 A | 10/1996 | Zhang et al. | |
| 5,569,936 A | 10/1996 | Zhang et al. | |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |
| 5,646,424 A | 7/1997 | Zhang et al. | |
| 5,654,203 A | 8/1997 | Ohtani et al. | |
| 5,656,825 A | 8/1997 | Kusumoto et al. | |
| 5,663,077 A | 9/1997 | Adachi et al. | |
| 5,677,549 A | 10/1997 | Takayama et al. | |
| 5,696,386 A | 12/1997 | Yamazaki | |
| 5,696,388 A | 12/1997 | Funada et al. | |
| 5,700,333 A | 12/1997 | Yamazaki et al. | |
| 5,705,829 A | 1/1998 | Miyanaga et al. | |
| 5,712,191 A | 1/1998 | Takayama et al. | |
| 5,756,364 A | 5/1998 | Tanaka et al. | |
| 5,837,614 A | 11/1998 | Yamazaki et al. | |
| 5,866,932 A | 2/1999 | Yamazaki et al. | |
| 6,025,630 A | 2/2000 | Yamazaki et al. | |

* cited by examiner

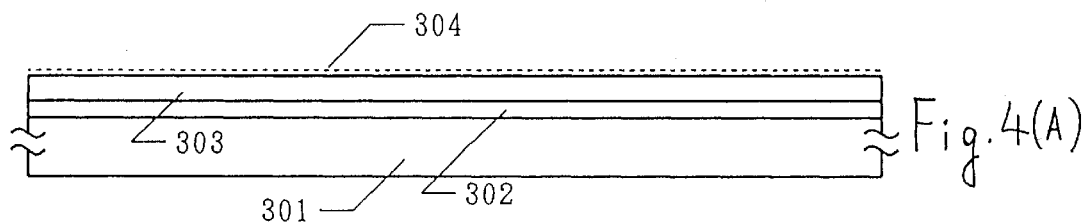
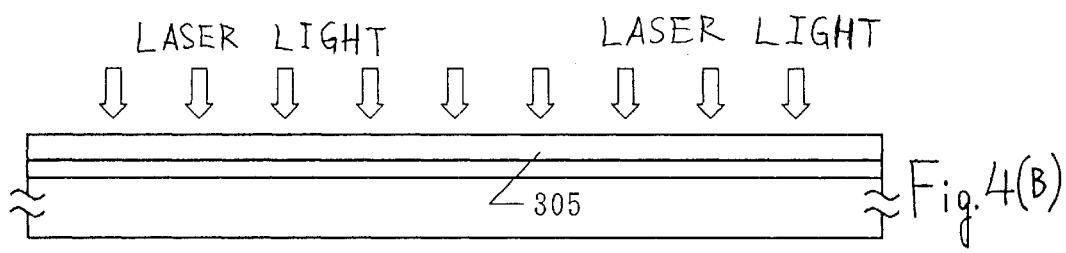
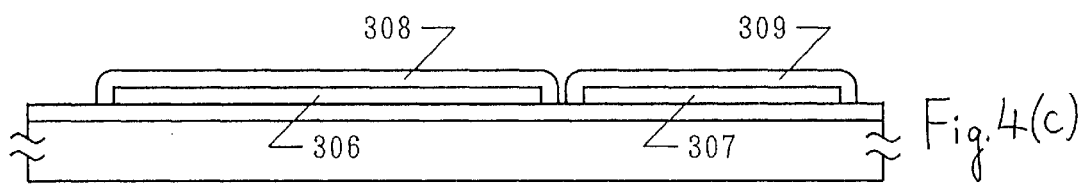
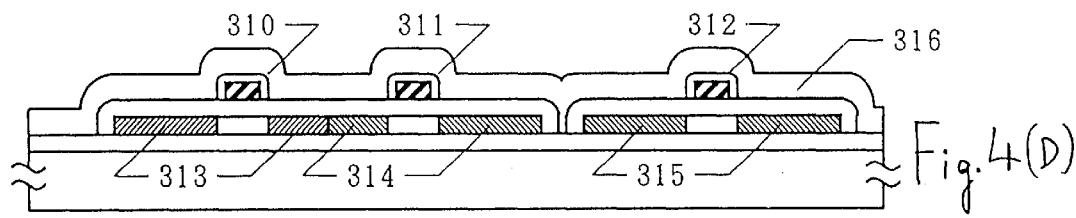
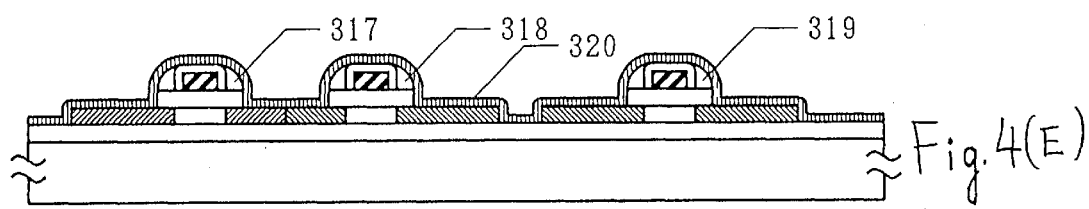
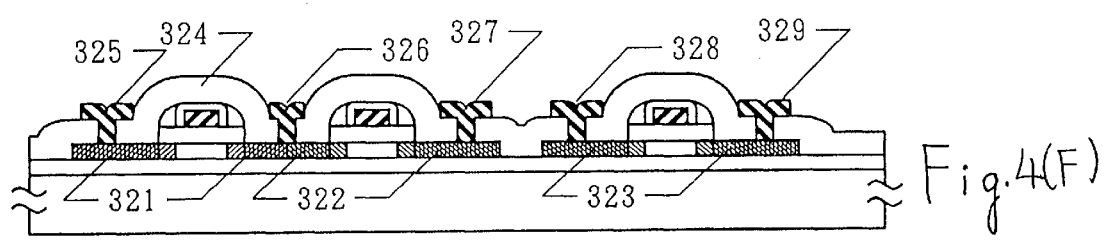

METHOD OF MAKING CRYSTAL SILICON SEMICONDUCTOR AND THIN FILM TRANSISTOR

FIELD OF THE INVENTION

The present invention relates to a method of making a semiconductor whose major component is silicon having crystalline property, more particularly, to a method of making a crystalline silicon semiconductor used in a semiconductor element such as a thin film transistor.

BACKGROUND OF THE INVENTION

Conventionally, a thin film transistor (hereinafter, TFT) using a thin film semiconductor has been known. TFT is constituted by using a thin film semiconductor formed on a substrate. TFT is used in various integrated circuits, especially in an electrooptical device such as a liquid crystal display, particularly as a switching element at a respective pixel of a liquid crystal display device of an active matrix type or a driver element formed in a peripheral circuit portion.

Although it is simple and convenient that an amorphous silicon film is used as a thin film semiconductor of TFT, its electric properties are poor. It is preferable to use a silicon thin film having crystalline property for promoting the properties of TFT. To provide a silicon film having crystalline property, an amorphous silicon film is firstly formed and crystallized thereafter by heating it or by irradiating thereon an electromagnetic wave having high energy such as a laser beam.

However, the crystallization by heating needs to take a time period of 10 hours or more at a heating temperature of 600° C. or more and accordingly, it is difficult to use a glass substrate. For example, the glass strain point of Corning 7059 generally used in an active type liquid crystal display device is 593° C. and therefore, the heating at 600° C. or more is problematic when area expansion of a substrate is considered. Further, the properties of the obtained crystalline silicon film are poorer than those of a film provided by a laser beam irradiation as follows.

It has been revealed that an element having a catalytic action accelerating crystallization of amorphous silicon is used to solve the problem as is disclosed in Japanese Unexamined Patent Publication Nos. 244103/1994, 244104/1994, 244105/1994, 244205/1994 and 296023/1994. That is, it has been revealed that the crystallization can be performed in a processing time of approximately 4 hours at 600° C. or less, typically, 550° C. by making an element of nickel, palladium, lead or the like adhere to an amorphous silicon film in a very small amount and heating it thereafter.

However, the catalyst element remains in such a process in the silicon film obtained in such a short period of time at such a low temperature and the properties of TFT using the silicon film are not preferable. Especially, it is the most serious problem in TFT that when a backwardly biased voltage (negative voltage in N-channel TFT, positive voltage in P-channel TFT) is applied on the gate, the absolute value of a drain current (off current or leakage current) is large and the value is considerably dispersed among respective elements.

Especially, the large off current causes a serious problem when the silicon film is used in a switching transistor of a pixel electrode in an active matrix type liquid crystal display device. When the off current of a thin film transistor arranged at a pixel electrode is large, the pixel electrode cannot hold electric charge during a predetermined time period which causes flickering of a screen and an obscure display.

SUMMARY OF THE INVENTION

In view of the current status it is an object of the present invention to provide a method of making a crystal silicon semiconductor film capable of reducing the off current of TFT and reducing the off current value of each element and its dispersion by adopting a step of crystallizing a silicon film by using a catalyst element promoting crystallization of silicon, especially, a method of making a crystal silicon semiconductor capable of being treated at a low temperature and preferable to mass production.

To achieve the above-mentioned object the present invention provides a silicon film having crystalline property by using the following steps.

Firstly, a silicon oxide film is deposited on an insulating surface by various chemical vapor deposition (CVD) processes, for example, plasma CVD process or thermal CVD process. The film forming temperature in this step is 450° C. or less, preferably, 300 through 350° C. The deposition may be performed by the plasma CVD process using, for example, tetraethoxysilane (TEOS) and oxygen or mono-silane ($SiH_4$) and dinitrogen monoxide ($N_2O$) or the thermal CVD process using mono-silane and oxygen.

An amorphous silicon film is deposited by various CVD processes on the silicon oxide film which has been deposited as mentioned above. For example, the film forming temperature of 295 through 305° C. is preferable in obtaining an amorphous silicon film by the plasma CVD process with mono-silane as raw material. However, it is necessary to form the amorphous silicon film without bringing the silicon oxide film into contact with the atmosphere. That is, the formation of the silicon oxide film and the amorphous silicon film needs to be continuously performed. It is preferable for this purpose to use a film forming device (cluster tool) of a publicly-known multichamber system.

Thereafter, a single substance of a catalyst element or a compound containing the catalyst element promoting crystallization of the amorphous silicon film is formed on the amorphous silicon film in a layer, a film or a cluster. Hereinafter, a layer of a single substance of a catalyst element or a compound containing the catalyst element is called a catalyst layer. The method of forming a catalyst layer will be mentioned later.

Further, the inventors found that the most significant effect is achieved when nickel is used as a catalyst element. The other usable catalyst elements are Pt, Cu, Ag, Au, In, Sn, Pd, P, As and Sb.

Thereafter, a heating process is performed on the amorphous silicon film by which a portion or a total of the amorphous silicon film is crystallized. In the process of crystallization, when the catalyst layer does not cover the total face of the amorphous silicon film, not only a region which the catalyst layer covers is crystallized but the crystallization is progressed from the region to peripheral portions.

In the crystallizing step the amorphous silicon film is heated at a temperature of 400° C. or more such that crystallization of the amorphous silicon film in which the catalyst element has been introduced is progressed. In a general glass substrate the heating temperature is 400° C. to 750° C. However, the heat resistant temperature differs by the kind of the glass substrate and accordingly, the upper limit of the heating temperature may be the strain point of glass. For example, the glass strain point is 593° C. for Corning 7059 glass and 667° C. for Corning 1737 glass.

Specifically, it is appropriate to determine the heating temperature as approximately 550° C. in view of heat resistance and productivity of a glass substrate.

It has been clarified that the higher the heating temperature, the more improved is the crystalline property of the silicon film. Therefore, the silicon film is heated at a temperature as high as possible so far as the substrate can stand the temperature in case where the crystalline property of the silicon film is mostly preferred. In this case it is preferable to use a quartz substrate which can stand a temperature of approximately 1000° C. For example, a quartz substrate can be heated at a temperature of approximately 800° C. through 1000° C.

The crystallization may more be promoted by irradiating a laser beam or an equivalent strong beam after the heating step. By adding this step portions which could not be crystallized in the previous step can be crystallized in which portions that have been crystallized in the previous step are used as nuclei.

The basic difference between the crystallization by the present invention and the conventional crystallization performed by irradiating a laser beam lies in that conditions determining the crystalline property are very severe in the conventional method since the amorphous silicon film is molten from a state of no crystals and thereafter crystallized. That is, when nuclei are not present, the cooling rate is a dominant factor determining the crystalline property in the crystallization process. However, the cooling rate considerably differs depending on the energy density of a laser beam and a temperature of the environment and necessarily, the optimum range of laser energy density is narrowed. If the energy is excessively high, the cooling rate from the molten state is excessively large bringing about an amorphous state. Further, if the energy is excessively low, the total of the film cannot be molten and amorphous portions remain.

Meanwhile, when nuclei are present, crystallization is facilitated and the dependency on the cooling rate is inconsiderable. Further, most of the film has been crystallized and therefore, an appropriate characteristic is guaranteed even if the energy density of the laser beam is low. In this way it is possible to stably provide a crystal silicon film having extremely improved crystalline property.

An incoherent strong beam, especially an infrared ray may be irradiated in a short period of time in place of the laser beam radiation. An infrared ray is difficult to absorb in glass and easy to absorb in a silicon thin film and accordingly, a silicon thin film formed on a glass substrate can selectively be heated which is preferable. A process of such an infrared ray in a short period of time is called rapid thermal annealing (RTA) or rapid thermal process (RTP).

As a method of forming a catalyst layer there are deposition process in which a vacuum device as in sputtering a single substance of a catalyst element or its compound is used and a deposition process in which a solution containing a catalyst element is coated on the surface of an amorphous silicon film in the atmosphere. Especially in the latter process the deposition can be performed reproducibly without capital investment. A detailed explanation will be given of the latter process as follows.

In the latter process an aqueous solution, an organic solution or the like can be used as a solution. In this specification "inclusion of a catalyst" indicates that a catalyst is included as a compound or a catalyst is included in dispersion.

As the solvent containing a catalyst element a polar solvent of water, an alcohol, an acid, or ammonia can be selected. In this case a thin oxide film may be formed on the surface of the amorphous silicon film since when the solution is directly coated on the silicon film, the solution is repelled therefrom. Thermal oxidation, oxidation by an oxidant such as hydrogen peroxide, oxidation by ultraviolet ray irradiation or the like may be used in forming the oxide film.

It is also useful to add a surfactant to a solution containing a catalyst element instead of forming an oxide film. The addition is for enhancing adherence and controlling adsorptiveness to a face to be coated. The surfactant may previously be coated on the face to be coated. As the surfactant a hydrocarbon chain basically containing approximately 10 through 20 carbon atoms as a hydrophobic radical may be used.

For example, as the surfactant there is a mixed solution of hydrofluoric acid, a solution of ammonium fluoride and water containing at least one material selected from the group consisting of surfactants comprising a salt of a fatty acid and carboxylic acid, a salt of a fatty acid and a carboxylic acid, a fatty acid amine and an aliphatic alcohol. The fatty acid may be designated by $C_n H_{2n+1}COOH$ (n is an integer of 5–11). A salt of a fatty acid may be designated by $C_n H_{2n+1}CONH_3R$ (n is an integer of 5–11. R designates a hydrogen atom or an alkyl group having a carbon number of 5–10). A fatty acid amine may be designated by a general formula of $C_m H_{2m+1}NH_2$ (m is an integer of 7–14). An aliphatic alcohol may be designated by a general formula of $C_n H_{2n+1}OH$ (n is an integer of 6–12).

Specific examples of the surfactants are shown in the following Tables 1 through 3. The following surfactants have an operation of dispersing a metal element when it adheres to the surface of the amorphous silicon film.

TABLE 1

$C_7F_{15}COOCN_4$
Perfluoroalkylsulfonic acid ammonium A
Perfluoroalkylsulfonic acid ammonium B
Perfluoroalkyl betaine
$RfCH_2CH_2O(CH_2CH_2O)_xH$ $C_9F_{17}SO_2N(C_2H_4O)_nH$
         |
         R Perfluoroalkyl trimethyle ammonium salt
Perfluoroalkyl carboxylic acid
$C_8F_{17}COOH$
Perfluoroalkyl polyoxyethylene ethanol
Fluorinated alkyl ester
Perfluoroalkyl EO additive A
Perfluoroalkyl EO additive B
Perfluoroalkyl carboxylic acid ammonium A
Perfluoroalkyl carboxylic acid ammonium B
Perfluoroalkyl carboxylic acid ammonium C $C_9F_{17}NC_3H_7$
      |
      $CH_2COONH_4$ $RfCH_2CH_2SCH_2CH_2N(CH_3)_3$
                 |
                 $CH_3SO_4$ $Rf N^+H_4 I^-$
$RfCH_2CH_2SCH_2CH_2CO_2NH_4$

TABLE 2

Alkyl diphenyletherdisulfonic acid salt
Octadecylamine acetate
Coconut amine acetate
Dialkyl sulfosuccinic acid ammonium
Dimethylalkyl (coconut) betaine
Stearylamine acetate
Soft alkylbenzenesulfonic acid ammonium
Dodecylbenzensulfonic acid ammonium
Dodecyltrimethyl ammonium chloride
Tri n-octylamine
Polyethylene glycol monostearate
Polyoxyethylene alkyl ether
Polyoxyethylene alkylphenyl ether
Polyoxyethylene alkylphenyl ether sulfate ammonium
Polyoxyethylene oleic acid ester
Polyoxyethylene higher alcohol
Polyoxyethylene nonylphenyl ether
Polyoxyethylene lanolin alcohol ether
Polyoxyethylene lanolinic acid ester
Polyoxyethylene lanolin fatty acid ester
Polycarboxylic acid ammonium
Monoglycerine ester
Lauryl triethanol sulfate amine
Lanolin alcohol

TABLE 3

$C_3H_7COOH$
$C_4H_9COOH$
$C_5H_{11}NH_2$
$C_6H_{13}NH_2$
$C_7H_{15}COOH$
$C_8H_{17}COOH$
$C_8H_{17}NH_2$
$C_8H_{17}OH$
$C_9H_{17}NH_2$
$C_9H_{17}COOH$
$C_{10}H_{21}NH_2$
$C_{10}H_{21}OH$
$C_{10}H_{21}COOH$
$C_{12}H_{25}NH_2$
$C_{13}H_{27}COOH$
$C_{14}H_{29}NH_2$
$C_{14}H_{29}NH_4$
$C_{14}H_{27}NH_2$
$C_{14}H_{29}COOH$
$C_{18}H_{37}NH_2$
$C_{18}H_{37}OH$
$C_{18}H_{37}NH_2$
$C_{20}H_{41}NH_2$
$(C_{10}H_{21})_2NH$
$RCOO(CH_2CH_2O)_nH$
$C_{11}H_{23}CO(CH_2CH_2)_nH$

When nickel is used as a catalyst and the nickel is included in a poler solvent, the nickel is introduced in the form of a nickel compound. Representative nickel compounds are selected from nickel bromide, nickel acetate, nickel oxalate, nickel carbonate, nickel chloride, nickel iodide, nickel nitrate, nickel sulfate, nickel formate, nickel acetylacetonato, nickel 4-cyclohexylbutyrate, nickel oxide and nickel hydroxide.

Further, when a simple substance of nickel is used as a catalyst element it is necessary to form a solution by solving nickel in an acid.

Solvents including a catalyst element may be selected from nonpolar solvents of benzene, toluene, xylene, carbon tetrachloride, chloroform and ether. In this case nickel is introduced in the form of a nickel compound. Representative nickel compounds may include nickel acetylacetonato and nickel 2-ethylhexanate.

Although the above-mentioned example uses solutions in which nickel as a catalyst element is completely dissolved, an emulsion in which a powder comprising a single substance of nickel or a nickel compound is uniformly dispersed in a dispersion medium may be used even if nickel is not completely dissolved. Or, a solution for forming an oxide film may be used. Such a solution includes OCD (Ohka Diffusion Source) of Tokyo Ohka Kogyo K.K. In using OCD solution, it is coated on a face to be processed and baked at approximately 200° C. by which a silicon oxide film can simply be formed. Further, the solution can be utilized in the present invention since impurities can be added thereto freely.

The same is applicable in case where a material other than nickel is used as a catalyst element.

It is preferable that the amount of the catalyst element included in the solution is 0.1 ppm through 200 ppm in a nickel amount with respect to a solution as a general tendency, preferably 1 ppm through 50 ppm (in weight), although depending on the kind of solution. This is a value determined in view of a nickel concentration in a film in which the crystallization has been finished or chemical resistance (for example, hydrofluoric acid resistance).

It has been revealed that the large off current of TFT made by using a crystallized silicon film is caused by an excessive presence of a catalyst element used in crystallization in crystals and the large dispersion of the off current is due to segregation of the catalyst element. Therefore, the off current can be reduced if the catalyst element is excluded from the silicon crystals to the outside after the crystallization step and a low concentration of the catalyst element can avoid the segregation.

Originally, the catalyst element cannot stably be present in silicon crystals and is excluded in a natural fashion. However, strong blocking layers (barrier) are actually formed on top and bottom of the silicon film and accordingly, the catalyst element is contained inside and is segregated on grain boundaries.

One of the characteristics of the present invention is continuous formation of an underlayer of the silicon oxide film and the amorphous silicon film. That is, no foreign layer is formed between the underlayer of the silicon oxide film and the amorphous silicon film by moisture, carbon dioxide and the like in the atmosphere. In the present invention the underlayer of the silicon oxide film and the amorphous silicon film are deposited at a low temperature of 450° C. or less and therefore, the oxide silicon film is very soft and the catalyst element excluded from the amorphous silicon film is swiftly incorporated in the silicon oxide film.

Conversely, almost no catalyst element is absorbed in the film if the underlayer is made of silicon nitride having a strong blocking action. Further, even with the silicon oxide film, if it is treated at a temperature exceeding 450° C., silicon oxide is solidified and absorption of the catalyst element is hindered.

At the initial stage of crystallization an interface between silicon oxide and silicon is in an indefinite state (a state in which an interface between different substances constituted by stoichiometric compositions is not recognized). However, the interface becomes definite with the progress of crystallization. Much of the catalyst element is present at the front end of crystallization and is moved with the progress of crystallization. Therefore, much of the catalyst element is absorbed in the silicon oxide film in the state in which all the silicon film has finally been crystallized.

The initially soft silicon oxide film is sufficiently solidified by an annealing step and almost no catalyst element which has been absorbed in the silicon oxide film does not retrogress into the crystal silicon film. Further, the trap level etc. can sufficiently be reduced. Therefore, no problem is caused with regard to reliability in the successive element formation.

BRIEF DESCRIPTION OF THE DRAWINGS

FIGS. 4(A), 4(B), 4(C), 4(D), 4(E) and 4(F) illustrate fabricating steps in Embodiment 3 (sectional view).

DETAILED DESCRIPTION OF THE PREFERRED EMBODIMENTS

Embodiment 1

Figure 1A:
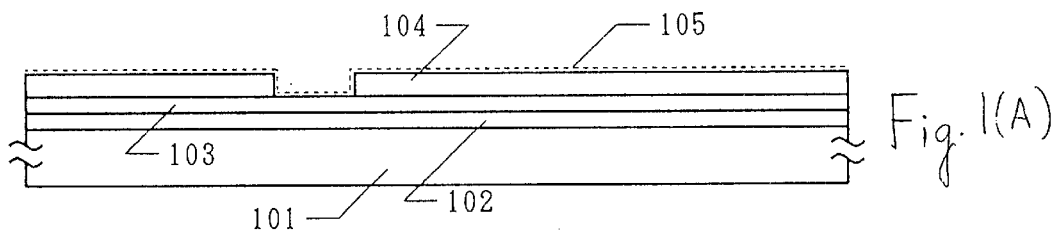
FIGS. 1(A), 1(B), 1(C), 1(D), 1(E) and 1(F) illustrate fabricating steps in Embodiment 1 (sectional view)
Figure 1B:
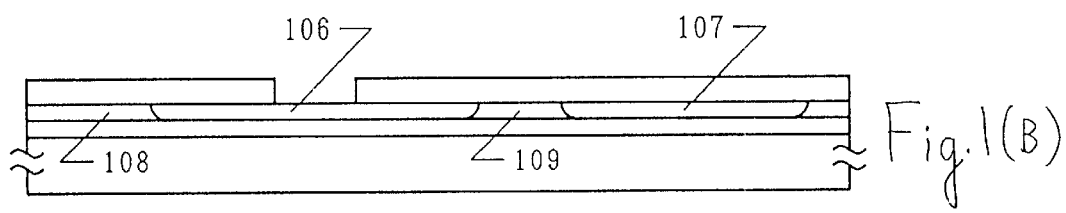
Figure 1C:
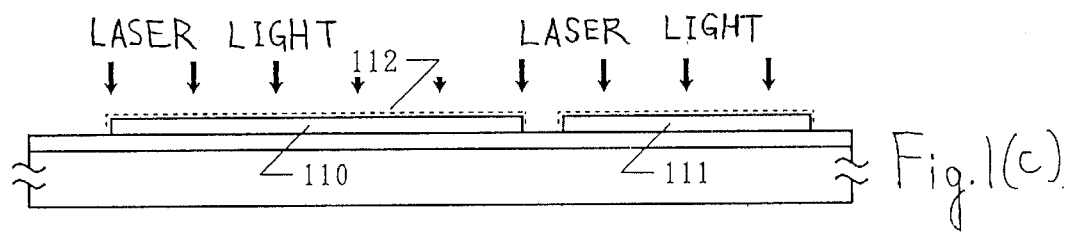
Figure 1D:
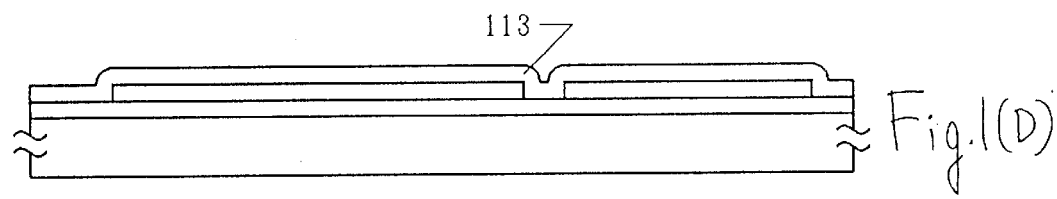
Figure 1E:
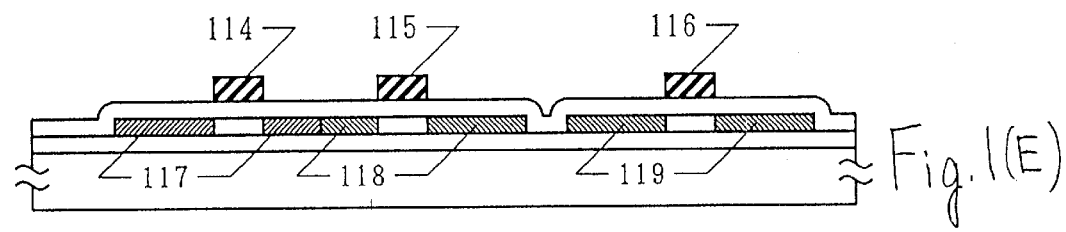
Figure 1F:
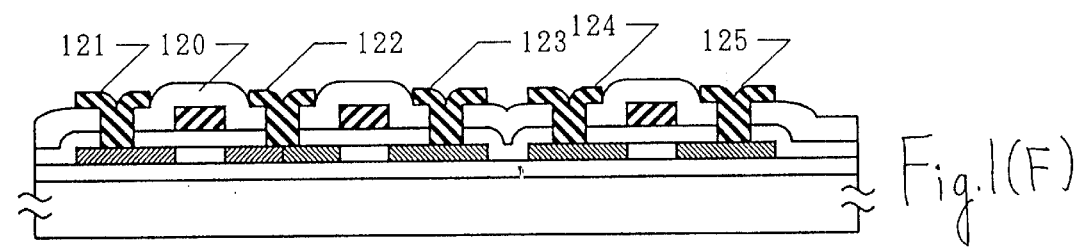

FIGS. 1(A), 1(B), 1(C), 1(D), 1(E) and 1(F) illustrate Embodiment 1. An underlayer of a silicon oxide film 102 having a thickness of 1000 through 5000 Å, for example, 1000 Å was formed on a substrate (Corning 7059 glass) 101. The silicon oxide film 102 was formed by using the plasma CVD process with TEOS and oxygen as raw material gases. The substrate temperature in film formation was 250° C. Trichloroethylene (TCE) was mixed in TEOS by 1 through 50%, representatively 20%. Chlorine was introduced to the underlayer of the silicon oxide film 102 by TCE whereby an effect of extracting a catalyst element contained in a silicon film was enhanced.

Successively, an amorphous silicon film 103 was formed by the plasma CVD process with mono-silane as raw material by a thickness of 100 through 1500 Å, for example, 800 Å. The film forming temperature of the amorphous silicon film 103 was 300° C. The formation of the silicon oxide film 102 and the amorphous silicon 103 was continuously performed by a cluster tool having two film forming chambers and the surface of the silicon oxide 102 was not brought into contact with the atmosphere.

Thereafter, a silicon oxide film 104 constituting a mask was formed by the plasma CVD process by a thickness of 500 Å through 3000 Å, for example, 1000 Å. The silicon oxide film 104 was also formed by the above-mentioned cluster tool under the same condition as in the underlayer of the silicon oxide film 102.

Further, a pattern was formed on the silicon oxide film 104 by a publicly-known photolithography and the amorphous silicon film 103 are selectively exposed by perforating it.

Further, the amorphous silicon film 103 was left in an aqueous solution of hydrogen peroxide by which an extremely thin silicon oxide film (not illustrated in figure) was formed at exposed portions of the amorphous silicon film 103 by a thickness of 10 through 100 Å. The accurate thickness of the silicon oxide film is not known since it is very thin. As another process of forming such a silicon oxide film an oxidation reaction by an ultraviolet ray irradiation in an oxygen atmosphere may be used. As a condition of this case an ultraviolet ray may be irradiated for 1 through 15 minutes in an oxygen atmosphere. Further, the thermal oxidation process may be used.

The silicon oxide film was coated for spreading an acetate solution all over the surface of the amorphous silicon film 103 in a later step in which an acetate solution including nickel was coated, that is, for improvement of wettability.

When the acetate solution is directly coated on the surface of the amorphous silicon film 103, the amorphous silicon repels the acetate solution and accordingly, nickel cannot be introduced all over the surface of the amorphous silicon film 103 and uniform crystallization cannot be performed. The object of forming such a thin silicon oxide film in this step is to alleviate the water repellency of the amorphous silicon film 103.

Next, the acetate solution added with nickel was prepared. The concentration of nickel was 100 ppm. Then, the acetate solution was dripped all over the surface by 2 ml and this state was held for 5 minutes. Spin drying (2000 rpm, 60 seconds) was performed by using a spinner.

After coating the solution the state was held for 1 through 10 minutes. Although the concentration of nickel finally contained in the amorphous silicon film 103 can be controlled by the hold time, the largest control factor is the concentration of the solution.

A layer (catalyst layer) 105 containing nickel having an average film thickness of several Å through several hundreds Å could be formed on the exposed surface of the amorphous silicon film 103 after the spin drying by performing the step of coating the nickel solution once through plural times. In this case nickel of the layer was diffused in the amorphous silicon film 103 in a successive heating step and operated as the catalyst promoting crystallization. Incidentally, the catalyst layer 105 was not necessarily a complete film. (FIG. 1(A))

Further, heating was performed in a heating furnace at 500 through 580° C. for 1 through 12 hours, at 550° C. for 8 hours in this embodiment, in a nitrogen atmosphere. As a result the crystallization was progressed from the perforated portions of the silicon oxide film 104 thereby providing crystallized silicon regions 106 and 107. Other regions 108 and 109 was in the state of amorphous silicon. (FIG. 1(B))

Figure 2A:
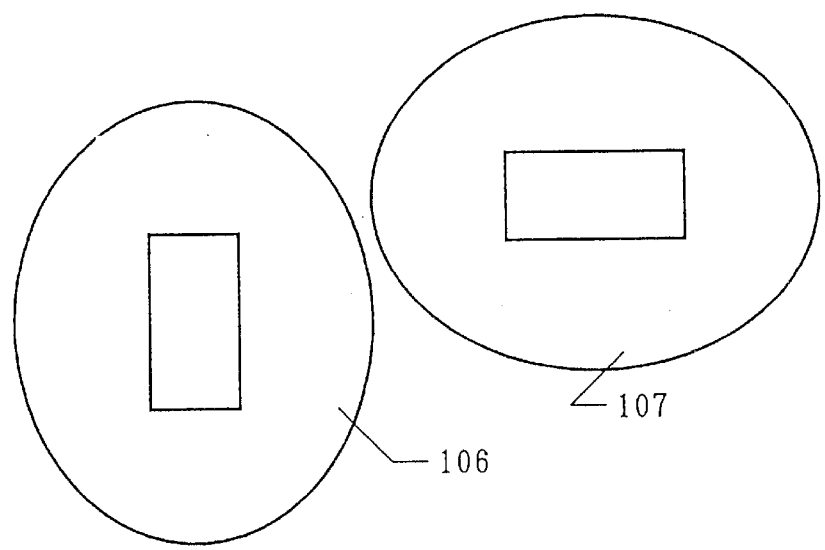
FIGS. 2(A), 2(B) and 2(C) illustrate fabricating steps in the Embodiment 1 (top view )

FIG. 2(A) is a top view showing the behavior. As apparent from FIG. 2(A) the crystallized silicon regions were expanded in an elliptical form from the perforated portions. (FIG. 2(A))

Thereafter, the silicon oxide film 104 was removed and a silicon film was patterned and etched by which insular silicon film regions 110 and 111 were formed. The etching of the silicon film was performed by the RIE process having anisotropy in the vertical direction. This became an activated layer of TFT. Thereafter, a heat treatment was performed at 550° C. in an oxygen atmosphere by which a very thin (up to 100 Å) silicon oxide film 112 was formed on the surfaces of the insular silicon film regions 110 and 111.

Then, several shots of KrF excimer laser (wavelength; 248 nm, pulse width; 30 nsec) were irradiated thereon with a power density of 200 through 400 mJ/cm$^2$, for example, 300 mJ/cm$^2$ in a nitrogen atmosphere or in the atmosphere by which the crystalline property of the insular silicon film regions 110 and 111 was further promoted. Other than KrF excimer laser, excimer lasers such as XeCl laser (wavelength; 308 nm), ArF laser (wavelength, 193 nm), XeF laser, (wavelength; 353nm) or the like might be used. Further, the RTA method could be used. (FIG. 1(C))

Thereafter, a silicon oxide film 113 was formed as a gate insulating film with a thickness of 1000 Å by the sputtering method or the plasma CVD method. In using the sputtering method silicon oxide was used for a target, the substrate temperature in sputtering was 200 through 400° C., for example, 350° C. and the sputtering atmosphere was constituted by oxygen and argon in which argon/oxygen=0–0.5, for example, 0.1 or less. (FIG. 1(D))

Figure 2B:
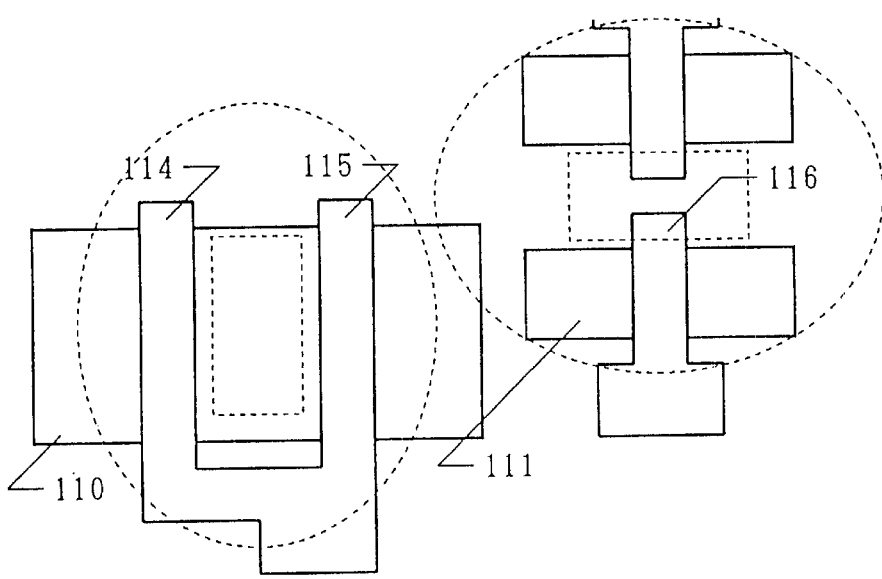

Successively, a silicon film (containing 0.1 through 2% of phosphor) having a thickness of 3000 through 8000 Å, for example, 6000 Å was formed by the low pressure CVD process. Incidentally, it is preferable to continuously perform the step of forming the silicon oxide film 113 and the step of forming the silicon film. The silicon film was patterned and gate electrodes 114 through 116 were formed. FIG. 2(B) is a top view showing the behavior. The ellipses drawn by the dotted lines in FIG. 2(B) correspond to the regions 106 and 107 in FIG. 2(A). (FIG. 2(B))

Next, impurities (phosphor and boron) were implanted to the activated layer by the ion doping process with the gate electrodes 114 through 116 as masks. Phosphine ($PH_3$) and diborane($B_2H_6$) were used as doping gases. In the former case the accelerating voltage was 60 through 90 kV, for example, 80 kV and in the latter case it was 40 through 80 kV, for example, 65 kV. The amount of dose was $1\times10^{14}$ through $8\times10^{15}$ cm$^{-2}$, for example, $1\times10^{15}$ cm$^{-2}$ for phospher and $2\times10^{15}$ cm$^{-2}$ for boron. In doping, the respective elements were selectively doped by covering by photoresist regions where the doping was not necessary. As a result N-type impurity regions 118 and 119 and a P-type impurity region 117 were formed.

Thereafter, an annealing was performed at 550 through 600° C. by which the impurity regions 117 through 119 implanted with ions were activated. As a result the impurity region 117 doped with an impurity (boron) providing P-type and the impurity regions 118 and 119 doped with an impurity (phosphor) providing N-type were activated. (FIG. 1(E))

Figure 2C:
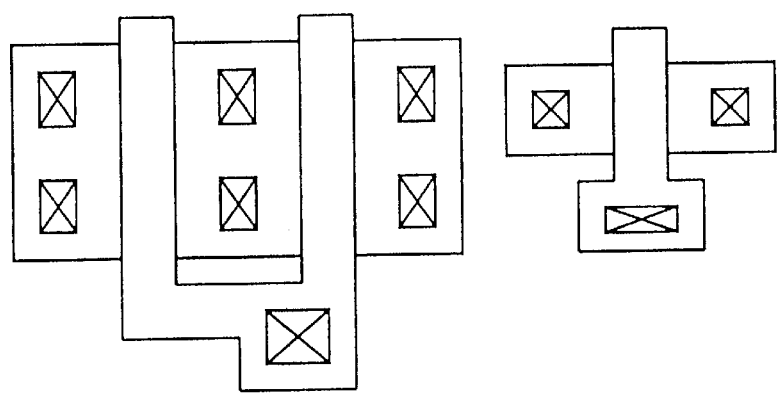
Figure 3A:
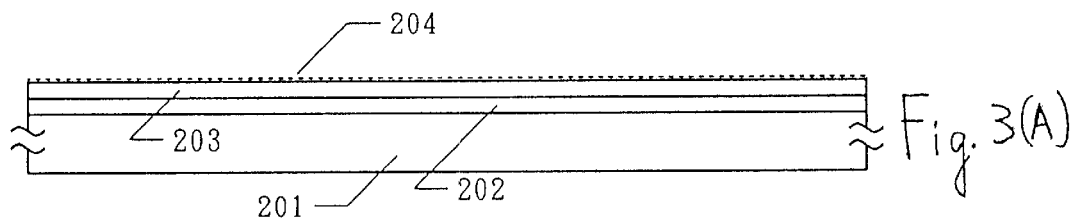
FIGS. 3(A), 3(B), 3(C), 3(D), 3(E) and 3(F) illustrate fabricating steps in Embodiment 2 (sectional view)
Figure 3B:
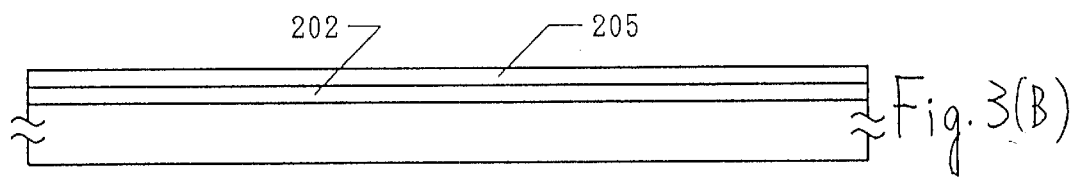
Figure 3C:
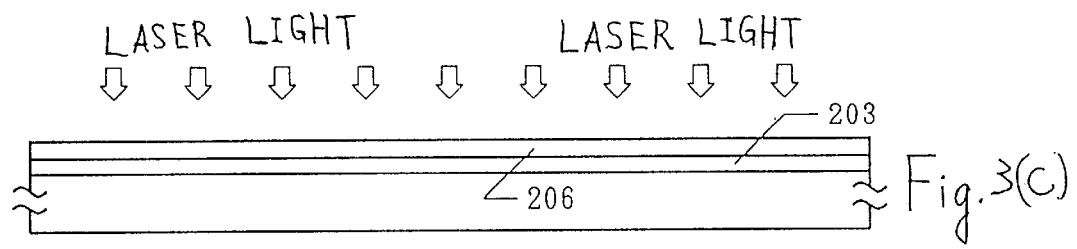
Figure 3D:
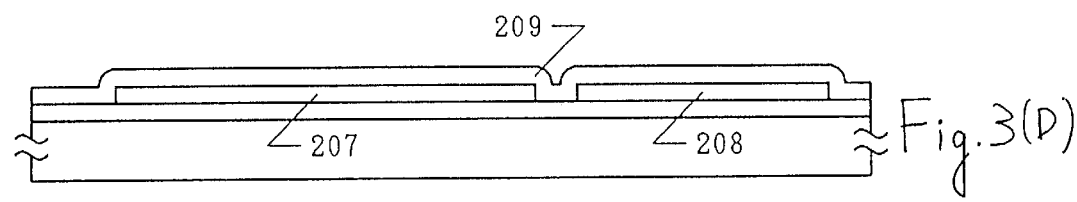
Figure 3E:
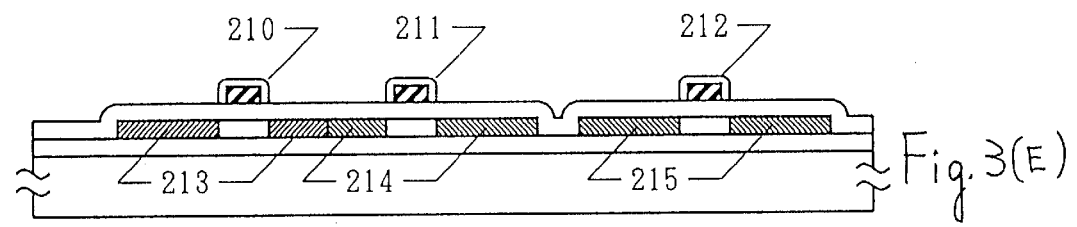
Figure 3F:
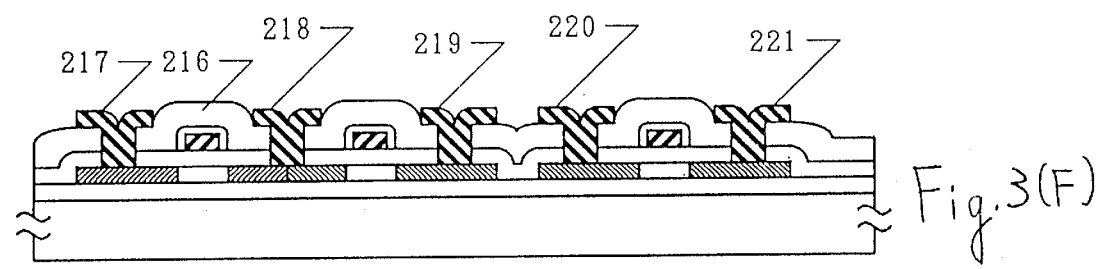

Successively, a silicon oxide film 120 having a thickness of 6000 Å was formed as an interlayer insulator by the plasma CVD process. Contact holes (locations of perforating contact holes are shown in FIG. 2(C)) of the interlayer insulator 120 were formed in which electrodes/leads 121 through 125 of TFT were formed by an aluminum film. Finally an annealing was performed at 310° C. for 30 minutes in a hydrogen atmosphere of 1 atm. The annealing may be performed after implanting hydrogen ions into the activated layer by accelerating them at 10 through 100 keV in the step of FIG. 1(C) or FIG. 1(D) in place of the hydrogen annealing. (FIG. 1(F))

In this way a circuit having TFT could be formed. In this embodiment an integrated circuit (so called monolithic type active matrix circuit) having an active matrix circuit and a logical circuit for driving the active matrix circuit on the same substrate, can be formed by using a complementary circuit of N-channel of TFT and P-channel of TFT formed on the left insular region 110 in FIG. 2(B) mainly as a logical circuit and the right insular region 111 of TFT as a switching transistor of the active matrix circuit although this is a necessary minimum circuit for measuring basic properties of TFT.

Embodiment 2

FIGS. 3(A), 3(B), 3(C), 3(D), 3(E) and 3(F) indicate outline of fabricating steps in Embodiment 2. An undercoating layer of a silicon oxide film 202 was firstly formed on a glass substrate (Corning 1737) 201 by a thickness of 1000 through 5000 Å, for example, 2000 Å by the plasma CVD process with mono-silane and dinitrogen monoxide as raw materials. The film forming temperature was 350° C. Further, an amorphous silicon film 203 having a thickness of 1000 Å was deposited thereon by the plasma CVD process with mono-silane as raw material. The film forming temperature was 250° C. The silicon oxide film 202 and the amorphous silicon film 203 were continuously formed by using a cluster tool having two film forming chambers.

Next, an extremely thin silicon oxide film was formed by an aqueous solution of hydrogen peroxide on the surface of an amorphous silicon film 203. An acetate solution containing 1 through 30 ppm, for example, 10 ppm of nickel was dripped on the substrate by 5 ml (in case of 10 cm$^2$ substrate) as in Embodiment 1 and spin coating was performed at 50 rpm for 10 seconds by a spinner by which a uniform water film was formed all over the surface of the substrate. The state was held for 5 minutes and spin drying was performed at 2000 rpm for 60 seconds by using the spinner. The holding step might be performed by rotating the spinner at 0 through 150 rpm. In this way a catalyst layer 204 containing nickel was formed. (FIG. 3(A))

Thereafter, an annealing was performed at 550° C. for 4 hours in a nitrogen atmosphere by which the amorphous film 203 was crystallized. At this occasion nickel moved from the amorphous silicon film 203 to the underlayer of the silicon oxide film 202 and the crystallization was progressed from top to bottom. In this way a crystal silicon film 205 was obtained wherein amorphous portions having a size of approximately several $\mu$m were observed. (FIG. 3(B))

After the crystallizing step by the annealing process XeCl laser (wavelength; 308 nm) was irradiated further enhancing the crystalline property of the silicon film 205. When the substrate 201 or the face to be irradiated with the laser beam was heated in the irradiating step of the laser beam, the uniformity could more be enhanced and the necessary laser energy density could be reduced. The preferable heating temperature was 200° C. through 450° C. By this step amorphous components in the silicon film 205 were completely crystallized by which the crystalline property can be enhanced. In this way a crystal silicon film 206 was provided. (FIG. 3(C))

Further, this step might be performed by the rapid thermal annealing (RTA). Specifically, an infrared ray having a peak in the wave length of 0.6 through 4 $\mu$m, here, 0.8 through 1.4 $\mu$m was irradiated for 30 through 180 seconds. 0.1 through 10% of HCl might be mixed in the atmosphere.

A halogen lamp was used as the light source of the infrared ray. The intensity of the infrared ray was adjusted such that a temperature of a monitor on a single crystal silicon wafer was in a range of 900 through 1200° C. Specifically, a temperature of a thermocouple embedded in the silicon wafer was monitored and fed back to the light source of the infrared ray. In this embodiment the rate of temperature elevation was constantly 50 through 200° C. per second and the rate of temperature drop was 20 through 100° C. per second in natural cooling. The infrared ray irradiation may be performed in a state in which the substrate is held at room temperature. However, to enhance the effect it may be performed in a state in which the substrate is previously heated at 200 through 450° C., for example, 400° C.

Next, the crystal silicon film 206 was etched by which insular silicon film regions 207 and 208 were formed. The etching of the crystal silicon film 206 was performed by the RIE process having anisotropy in the vertical direction.

Thereafter, a silicon oxide film 209 having a thickness of 1000 Å was formed as a gate insulating film by the plasma CVD process with mono-silane and dinitrogen monoxide as raw materials. The substrate temperature in forming the film may be 200 through 400° C., for example, 350° C. and after the step a thermal annealing may be performed at 550 through 650° C. in nitrogen or dinitrogen monoxide. (FIG. 3(D))

Successively, an aluminum film (containing 0.1 through 2% of scandium) having a thickness of 3000 through 8000

Å, for example, 4000 Å was formed by the sputtering method. Further, the aluminum film was etched by which gate electrodes 210 through 212 were formed. Anodic oxidation was performed on the gate electrodes 210 through 212 by flowing electricity in an electrolytic solution by which an aluminum oxide film having a thickness of 1000 through 3000 Å, here, 2000 Å was formed on top faces and side faces of the gate electrodes 210 through 212. The anodic oxidation was performed in an ethylene glycol solution containing 1 though 5% of tartaric acid. Incidentally, the aluminum oxide layer provides a thickness forming an offset gate region in a later ion doping step and accordingly, the length of the offset gate region can be determined by the above-mentioned anodic oxidation step. (Refer to Japanese Unexamined Patent Publication Nos.114724/1993, 267667/1993 and 291315/1994)

Next, impurities providing P or N conductive type in a self-aligning way were added to the active layer region by the ion doping process with the gate electrode portions (gate electrodes 210 through 212 and surrounding oxide layers) as masks. Phosphine ($PH_3$) and diborane($B_2H_6$) were used as doping gases. In the former case the accelerating voltage was 80 kV and the amount of dose was $5\times10^{14}$ $cm^{-2}$ and in the latter case the accelerating voltage was 65 kV and the amount of dose was $1\times10^{15}$ $cm^{-2}$. In doping, the respective elements were selectively doped by covering unnecessary regions with a photoresist. As a result impurity regions of N-type 214 and 215 and an impurity region of P-type 213 were formed.

Thereafter, an annealing was performed by irradiating a laser beam and the impurity regions implanted with ions were activated. Although KrF excimer laser(wavelength; 248 nm, pulse width; 20 nsec) was used as the laser beam, other laser beams may be substituted therefor. As conditions of irradiating the laser beam, the energy density was 200 through 400 $mJ/cm^2$, for example, 250 $mJ/cm^2$ and the number of shots was 2 through 10, for example, 2 per one location. The uniformity of resistance was promoted by heating the substrate at approximately 200 through 450° C. in irradiating the laser beam. In this way the impurity regions 213 through 215 were activated. The activation of the impurities might be performed by the RTA process in place of the laser annealing. (FIG. 3(E))

Successively a silicon oxide film 216 having a thickness of 6000 Å was formed as an interlayer insulator by the plasma CVD process. Further, contact holes were formed at the interlayer insulator 216 and electrodes/leads 217 through 221 of TFT were formed by a metallic material, for example, a chromium film. (FIG. 3(F))

Embodiment 3

FIGS. 4(A), 4(B), 4(C), 4(D), 4(E) and 4(F) illustrate Embodiment 3. An undercoating layer 302 of silicon oxide having a thickness of 2000 Å was formed on a quartz substrate 301 by the thermal CVD process with mono-silane and oxygen as raw materials. The film forming temperature was 420° C. Further, an amorphous silicon film 303 having a thickness of 500 Å was formed thereon by the plasma CVD process. The underlayer of the silicon oxide film 302 and the amorphous silicon film 303 were continuously formed by using a multichamber film forming device having two film forming chambers.

Further, a nickel acetate layer 304 having a thickness of 20 through 50 Å was formed by the spin coating process as in Embodiment 2. However, in this embodiment a surfactant (higher alcohol group nonionic surfactant) was added to an aqueous solution of nickel acetate by 1 volume %. Therefore, different from Embodiment 2, it is not necessary to form a silicon oxide film on the surface of the amorphous silicon film 303. (FIG. 4(A))

Thereafter, an annealing was performed at 550° C. for 4 hours in a nitrogen atmosphere by which the amorphous silicon film 303 was crystallized. The crystallization was progressed in the longitudinal direction as in Embodiment 2 with regions at which nickel and the amorphous silicon film 303 were brought into contact as starting points. In this way a crystal silicon film 305 was obtained. In this embodiment remaining amorphous regions were smaller than those in Embodiment 2 due to the effect of the surfactant. After the annealing had been finished, the crystalline property of the crystal silicon film 305 was further improved by irradiation of KrF excimer laser. (FIG. 4(B))

Next, the crystal silicon film 305 was etched by which insular active layer regions 306 and 307 were formed. The crystal silicon film 305 was etched by the RIE process having anisotropy in the vertical direction.

Thereafter, the surfaces of the activated layer regions 306 and 307 were oxidized by a thickness of 200 through 800 Å, representatively, 500 Å by leaving them in an oxygen atmosphere containing 10% of vapor at 1 atm. and at 650 through 850° C., representatively, 750° C. for 3 through 5 hours by which oxide silicon films 308 and 309 were formed. Pyrogenic oxidation process (hydrogen:oxygen= 1.8–1.0 (volume ratio)) was effective in forming the oxide silicon films 308 and 309 in view of film thickness controllability. The thicknesses of the silicon oxide films 308 and 309 were 400 through 1600 Å, 1000 Å in this embodiment. After forming the silicon oxide films 308 and 309 an annealing was performed at 800° C. for 1 hour in a dinitrogen monoxide atmosphere at 1 atm. by which hydrogen in the silicon oxide films 308 and 309 was removed. (FIG. 4(C))

Successively, an aluminum film (containing 0.1 through 2% of scandium) was formed by a thickness of 3000 through 8000 Å, for example, 5000 Å by the sputtering method. Further, the aluminum film was patterned by which gate electrodes 310 through 312 were formed. An anodic oxidation was performed on the gate electrodes 310 through 312 by flowing current in an electrolytic solution as in Embodiment 2 by which an aluminum oxide film having a thickness of 1000 through 3000 Å, here, 2000 Å was formed on top faces and side faces of the gate electrodes 310 through 312.

Next, impurities providing P or N conductive type in a self-adjusting way were added to the activated layer regions (constituting source/drain, channel) by the ion doping process with gate electrode portions, that is, the gate electrodes 310 through 312 and the surrounding oxide layers as masks. Phosphine ($PH_3$) and diborane($B_2H_6$) were used as doping gases. In the former case the accelerating voltage was 80 kV and the amount of dose was $5\times10^{14}$ $cm^{-2}$ and in the latter case the accelerating voltage was 65 kV and the amount of dose was $1\times10^{15}$ $cm^{-2}$. As a result impurity regions of N-type 314 and 315 and an impurity region of P-type 313 were formed.

Thereafter, an annealing was performed by irradiating a laser beam and the ion-implanted impurities were activated. As the laser beam KrF excimer laser (wavelength; 248 nm, pulse width; 20 nsec) was used.

Next, a silicon oxide film 316 was formed by the plasma CVD process. It is important that the silicon oxide film 316 is excellent in the coating performance with respect to side faces of the gate electrodes. The thickness of the silicon oxide film 316 was 0.5 through 1 μm, for example, 0.7 μm. (FIG. 4(D))

Further, the insulative silicon oxide film 316 was anisotropically etched by means of dry etching or the like. That is, the etching was performed selectively only in the vertical direction. As a result the surfaces of the regions 313 through 315 for constituting sources or drains were exposed and insulators 317, 318 and 319 having an approximately triangular shape remained on the side faces of the respective gate electrodes (including surrounding anodically oxidized layers) 310 through 312.

The dimensions, especially the width of the insulators 317 through 319 having an approximately triangular shape are determined by the thickness of the previously formed silicon oxide film 316, the etching conditions and the height of the gate electrodes (including surrounding anodically oxidized layer) 310 through 312. Further, the shape of the obtained insulators 317 through 319 is not restricted to a triangular shape but the shape is changed in accordance with the step coverage and the film thickness of the silicon oxide film 316. For example, the shape becomes square when the film thickness is small.

Further, a titanium film 320 having a thickness 50 through 500 Å was formed by the sputtering method. Molybdenum, tungsten, platinum, palladium etc. may be substituted for titanium. (FIG. 4(E))

Further, after the film formation an annealing was performed at 200 through 650° C., preferably, 400 through 500° C. by which the titanium film 320 reacted with silicon in the impurity regions 313 through 315 for constituting sources or drains thereby forming silicide layers 321, 322 and 323 in the source/drain regions.

Thereafter, a nonreacted portion of the titanium film 320 (mainly deposited on the insulators 317 through 319 or an anodically oxidized layer) was etched by an aqueous solution of hydrogen peroxide and an aqueous solution of ammonium. Further, a silicon oxide film was formed all over the surface as an interlayer insulator 324 by a thickness of 6000 Å using the thermal CVD process. Contact holes were formed at sources/drains of TFT and multilayers of titanium and aluminum were deposited and etched whereby leads/electrodes 325 through 329 were formed. The thicknesses of the titanium layer and the aluminum layer were respectively 800 Å and 5000 Å. Finally, an annealing was performed at 350° C., for 30 minutes in a hydrogen atmosphere at 1 atm. by which a TFT circuit was completed. (FIG. 4(F))

According to the present invention a silicon film having an excellent crystalline property can stably be provided. The crystalline silicon film provided by the present invention is extremely suitable for making TFT as shown in the embodiments and accordingly, the present invention is extremely useful in industry.

What is claimed is:

1. A method for fabricating a semiconductor device, said method comprising the steps of:
    forming an oxide film over an insulating surface in a film forming device;
    continuously forming an amorphous semiconductor film comprising silicon on the oxide film in the film forming device without exposing the oxide film to the atmosphere;
    introducing a material capable of promoting crystallization of silicon in contact with the amorphous semiconductor film;
    crystallizing at least a portion of the amorphous semiconductor film;
    wherein the oxide film includes chlorine.

2. A method according to claim 1, wherein the material is at least one selected from the group consisting of Ni, Pd, Pt, Cu, Ag, Au, In, Sn, P, As and Sb.

3. A method according to claim 1, wherein the amorphous semiconductor film is formed at a temperature in a range of 450° C. or less.

4. A method according to claim 1, wherein the oxide film is formed to a thickness in a range of 1000 to 5000 Å.

5. A method according to claim 1, wherein the silicon oxide film is formed at a temperature not higher than 450° C.

6. A method according to claim 1 wherein the oxide film and the amorphous semiconductor film are continuously formed by using a multichamber film forming device.

7. A method according to claim 1 wherein the oxide film is formed by plasma chemical vapor deposition or thermal chemical vapor deposition.

8. A method according to claim 1 wherein the oxide film is formed from mono-silane and dinitrogen monoxide as raw materials.

9. A method according to claim 1 wherein the oxide film is formed from tetraethoxysilane and oxygen as raw materials.

10. A method according to claim 1, wherein the halogen element is chlorine.

11. A method according to claim 1, further comprising a step of introducing hydrogen ions into the crystallized semiconductor film after the crystallizing step.

12. A method of fabricating a semiconductor device, said method comprising the steps of:
    forming a silicon oxide film over an insulating surface through a plasma CVD at a temperature in a range of 450° C. or less in a film forming device;
    continuously forming an amorphous semiconductor film comprising silicon on the silicon oxide film in the film forming device without exposing the silicon oxide film to atmosphere;
    introducing a material capable of promoting crystallization of silicon in contact with the amorphous semiconductor film;
    crystallizing at least a portion of the amorphous silicon film by heating the amorphous silicon film,
    wherein the silicon oxide film is formed from tetra ethoxy silane and oxygen as material gases and trichloroethylene is mixed to the tetra ethoxy silane, whereby chlorine is introduced into the silicon oxide film.

13. A method according to claim 12, further comprising a step of introducing hydrogen ions into the crystallized semiconductor film after the crystallizing step.

14. A method for fabricating a semiconductor device, said method comprising the steps of:
    forming a silicon oxide film over an insulating surface through a plasma CVD at a temperature in a range of 450° C. or less in a film forming device;
    continuously forming an amorphous semiconductor film comprising silicon on the silicon oxide film in the film forming device without exposing the oxide film to the atmosphere; and
    introducing a material capable of promoting crystallization of silicon in contact with the amorphous semiconductor film;
    crystallizing at least a portion of the amorphous semiconductor film by heating;
    irradiating the crystallized semiconductor film with a light to improve crystallinity of the crystallized semiconductor film;

wherein the silicon oxide film is formed from tetra ethoxy silane and oxygen as material gases, wherein the silicon oxide film includes chlorine.

15. A method according to claim 14, wherein the material is at least one selected from the group consisting of Ni, Pd, Pt, Cu, Ag, Au, In, Sn, P, As and Sb.

16. A method according to claim 14 wherein the light is irradiated by XeCl laser or KrF laser.

17. A method according to claim 14 wherein the step of irradiating the light is rapid thermal annealing (RTA).

18. A method according to claim 14, wherein the halogen element is chlorine.

19. A method according to claim 14, further comprising a step of annealing the crystallized semiconductor film in a hydrogen atmosphere after the irradiating step.

20. A method according to claim 14 wherein the silicon oxide film and the amorphous semiconductor film are continuously formed by using a multichamber film forming device.

21. A method for fabricating a thin film transistor, said method comprising the steps of:

forming an oxide film over a quartz substrate in a film forming device;

continuously forming an amorphous semiconductor film comprising silicon on the oxide film in the film forming device without exposing the oxide film to the atmosphere;

introducing a material capable of promoting crystallization of the amorphous semiconductor film in contact with the amorphous semiconductor film;

crystallizing at least a portion of the amorphous semiconductor film;

patterning the semiconductor film into at least one semiconductor island to form an active layer;

irradiating with a light to the semiconductor island to improve crystallinity of the semiconductor island;

forming a gate insulating film over the semiconductor island;

introducing hydrogen ions into the semiconductor island;

annealing the semiconductor island after the step of introducing hydrogen ions; and forming a gate electrode on the gate insulating film, wherein the oxide film includes chlorine whereby the material is extracted from the active layer to the oxide film so that the material in the active layer is decreased or removed.

22. A method according to claim 21, wherein the material is at least one selected from the group consisting of Ni, Pd, Pt, Cu, Ag, Au, In, Sn, P, As and Sb.

23. A method according to claim 21, wherein the amorphous semiconductor film is formed at a temperature in a range of 450° C. or less.

24. A method according to claim 21, wherein the silicon oxide film is formed at a temperature not higher than 450° C.

25. A method according to claim 21 wherein the oxide film and the amorphous semiconductor film are continuously formed by using a multichamber film forming device.

26. A method according to claim 21 wherein the oxide film is formed by plasma chemical vapor deposition or thermal chemical vapor deposition.

27. A method according to claim 21 wherein the oxide film is formed from mono-silane and dinitrogen monoxide as raw materials.

28. A method according to claim 21 wherein the oxide film is formed from tetraethoxysilane and oxygen as raw materials.

29. A method according to claim 21 further comprising a step of irradiating a light to improve crystallinity of the crystallized semiconductor film.

30. A method according to claim 29 wherein the light is irradiated by XeCl laser or KrF laser.

31. A method according to claim 29 wherein the step of irradiating the light is rapid thermal annealing (RTA).

32. A method according to claim 21, wherein the halogen element is chlorine.

33. A method according to claim 21, further comprising a step of introducing hydrogen ions into the semiconductor island after the step of irradiating with the light or forming the gate electrode.

* * * * *